United States Patent
Sato et al.

(10) Patent No.: US 10,590,341 B2
(45) Date of Patent: Mar. 17, 2020

(54) WAVELENGTH CONVERSION MEMBER, PRODUCTION METHOD THEREFOR, AND LIGHT EMITTING DEVICE

(71) Applicant: NGK SPARK PLUG CO., LTD., Nagoya, Aichi (JP)

(72) Inventors: Yumi Sato, Sendai (JP); Yoshifumi Tsutai, Tomiya (JP); Takashi Abe, Tomiya (JP); Yutaka Sato, Funabashi (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 0 days.

(21) Appl. No.: 16/092,687

(22) PCT Filed: Apr. 24, 2017

(86) PCT No.: PCT/JP2017/016240
§ 371 (c)(1),
(2) Date: Oct. 10, 2018

(87) PCT Pub. No.: WO2017/188191
PCT Pub. Date: Nov. 2, 2017

(65) Prior Publication Data
US 2019/0127636 A1    May 2, 2019

(30) Foreign Application Priority Data
Apr. 25, 2016 (JP) .................. 2016-087114

(51) Int. Cl.
*H01L 33/50* (2010.01)
*C09K 11/77* (2006.01)
(Continued)

(52) U.S. Cl.
CPC .......... *C09K 11/7706* (2013.01); *C09K 11/02* (2013.01); *C09K 11/08* (2013.01);
(Continued)

(58) Field of Classification Search
CPC ......... F21K 9/64; F21V 9/30; C09K 11/7706; C09K 11/08; C09K 11/02; H01L 33/50; H01S 5/02; G02B 5/20
See application file for complete search history.

(56) References Cited

U.S. PATENT DOCUMENTS

| | | |
|---|---|---|
| 2003/0080341 A1 | 5/2003 | Sakano et al. |
| 2011/0279012 A1 | 11/2011 | Washizu et al. |

(Continued)

FOREIGN PATENT DOCUMENTS

| | | |
|---|---|---|
| JP | 2004-161806 A | 6/2004 |
| JP | 2011-137186 A | 7/2011 |

(Continued)

OTHER PUBLICATIONS

Japan Patent Office, International Search Report issued in corresponding Application No. PCT/JP2017/016240, dated Sep. 12, 2017.

(Continued)

*Primary Examiner* — Anne M Hines
(74) *Attorney, Agent, or Firm* — Stites & Harbison, PLLC; Jeffrey A. Haeberlin; James R. Hayne

(57) ABSTRACT

The invention provides a wavelength conversion member and a light emitting device which each has a reduced proportion of voids and transmits less source light without causing a decrease in light conversion efficiency offered by phosphor particles having a large particle size. A wavelength conversion member 100 is configured to convert light with a specific wavelength to light with other wavelength, and includes a substrate 110 including an inorganic material, and a phosphor layer 120 joined to the substrate 110 and including phosphor particles 122 that absorb light and emit converted light and a translucent ceramic 121 that binds the phosphor particles 122 to one another. The phosphor particles 122 include two kinds of particles each having a (Continued)

designated particle size distribution. The two kinds of particles are larger particles having a larger average particle size and smaller particles having a smaller average particle size wherein the ratio of the average particle size of the larger particles to the average particle size of the smaller particles is 2 to 4. The ratio of the volume of the larger particles to the volume of the smaller particles is not more than 5.7.

8 Claims, 6 Drawing Sheets

(51) Int. Cl.
  *H01S 5/02* (2006.01)
  *G02B 5/20* (2006.01)
  *C09K 11/08* (2006.01)
  *F21K 9/64* (2016.01)
  *F21V 9/30* (2018.01)
  *C09K 11/02* (2006.01)

(52) U.S. Cl.
  CPC ............... *F21K 9/64* (2016.08); *F21V 9/30* (2018.02); *G02B 5/20* (2013.01); *H01L 33/50* (2013.01); *H01S 5/02* (2013.01)

(56) References Cited

U.S. PATENT DOCUMENTS

| | | |
|---|---|---|
| 2013/0106277 A1 | 5/2013 | Ichikawa et al. |
| 2013/0257266 A1 | 10/2013 | Ishizaki |
| 2015/0077966 A1 | 3/2015 | Bessho et al. |
| 2015/0204494 A1 | 7/2015 | Wada et al. |
| 2015/0357532 A1 | 12/2015 | Onuma et al. |
| 2016/0197248 A1 | 7/2016 | Ishizaki |
| 2017/0217830 A1 | 8/2017 | Kadomi et al. |
| 2018/0275324 A1* | 9/2018 | Fujita ................ C09K 11/08 |

FOREIGN PATENT DOCUMENTS

| | | |
|---|---|---|
| JP | 2011-238811 A | 11/2011 |
| JP | 2012-124356 A | 6/2012 |
| JP | 2013-046046 A | 3/2013 |
| JP | 5454473 B2 | 3/2014 |
| JP | 2014-241431 A | 12/2014 |
| JP | 2015-038960 A | 2/2015 |
| JP | 2015-065425 A | 4/2015 |
| JP | 2015-090887 A | 5/2015 |
| JP | 2015-119172 A | 6/2015 |
| JP | 2015-138839 A | 7/2015 |
| JP | 2016-204561 A | 12/2016 |
| WO | 2011-142228 A1 | 11/2011 |
| WO | 2014-103671 A1 | 7/2014 |
| WO | 2015-041204 A1 | 3/2015 |
| WO | 2016-035543 A1 | 3/2016 |

OTHER PUBLICATIONS

Japan Patent Office, Written Opinion issued in corresponding Application No. PCT/JP2017/016240, dated Sep. 12, 2017.

Japan Patent Office, Office Action (Notification of Reasons for Refusal) issued in corresponding Application No. 2017-560823, dated Nov. 20, 2018.

Taiwan Intellectual Property Office, Office Action (Notification for the Opinion of Examination) issued in corresponding Taiwan Application No. 106113564, dated Oct. 18, 2018.

European Patent Office, Extended European Search Report issued in corresponding Application No. 17789473.0, dated Nov. 11, 2019.

* cited by examiner (a)

(b)

(c)

(a)

(b)

(c)

WAVELENGTH CONVERSION MEMBER, PRODUCTION METHOD THEREFOR, AND LIGHT EMITTING DEVICE

TECHNICAL FIELD

The present invention relates to a wavelength conversion member that converts light with a specific wavelength to light with other wavelength, to a method for the production of such wavelength conversion members, and to a light emitting device.

BACKGROUND ART

Light-emitting elements are known in which, for example, a wavelength conversion member in which phosphor particles are dispersed in a resin such as epoxy or silicone is disposed in contact with a blue LED element. In recent applications, LEDs are increasingly replaced by laser diodes (LDs) which have a high energy efficiency and are easily adaptable to miniaturization and increase in output.

Lasers apply high-energy light to a local site. When laser light is focused onto a resin, the irradiated site is burnt. A known approach to this problem is to use all-inorganic wavelength conversion members that contain an inorganic binder in place of a resin which constitutes the all-inorganic wavelength conversion member (Patent Literatures 1 to 6).

Further, techniques associated with structural materials are disclosed in which ceramic particles having two grain sizes are combined to enhance packing uniformity and packing density (Patent Literature 7). Patent Literature 7 describes that a metal-ceramic composite preform is preferably formed using ceramic particles having two grain sizes wherein the ratio of the average particle size of finer particles is controlled to 6 to 20.

CITATION LIST

Patent Literature

PTL 1: Japanese Unexamined Patent Application Publication No. 2015-90887
PTL 2: Japanese Unexamined Patent Application Publication No. 2015-38960
PTL 3: Japanese Unexamined Patent Application Publication No. 2015-65425
PTL 4: Japanese Unexamined Patent Application Publication No. 2014-241431
PTL 5: Japanese Unexamined Patent Application Publication No. 2015-119172
PTL 6: Japanese Unexamined Patent Application Publication No. 2015-138839
PTL 7: Japanese Unexamined Patent Application Publication No. 2011-137186

SUMMARY OF INVENTION

Technical Problem

Light emitting devices having such wavelength conversion members described above increasingly use laser diodes (LDs) in their applications. In such all-inorganic wavelength conversion members, the wavelength conversion efficiency is enhanced when the phosphor layer is formed of phosphor particles with a large particle size. If, however, the ratio of the film thickness to the particle size is reduced to suppress the generation of heat, the proportion of voids present between particles is increased and more excitation light is allowed to pass through. The passage of source light needs to be controlled particularly in applications where a large amount of fluorescence alone is to be emitted.

The present invention has been made in light of the circumstances described above. Objects of the invention are therefore to provide a wavelength conversion member which has a reduced proportion of voids and transmits less source light without causing a decrease in light conversion efficiency offered by phosphor particles having a large particle size, and to provide a method for producing such wavelength conversion members, and a light emitting device having such a wavelength conversion member.

Solution to Problem (1) To achieve the above objects, an aspect of the present invention is directed to a wavelength conversion member configured to convert light with a specific wavelength to light with other wavelength, wherein the wavelength conversion member includes a substrate including an inorganic material, and a phosphor layer joined to the substrate and including phosphor particles that absorb light and emit converted light and a translucent ceramic that binds the phosphor particles to one another, the phosphor particles include two kinds of particles each having a designated particle size distribution, the two kinds of particles are larger particles having a larger average particle size and smaller particles having a smaller average particle size wherein the ratio of the average particle size of the larger particles to the average particle size of the smaller particles is 2 to 4, and the ratio of the volume of the larger particles to the volume of the smaller particles is not more than 5.7.

With this configuration, the proportion of voids can be reduced and the passage of source light can be lessened without causing a decrease in light conversion efficiency offered by the larger particles. Further, the above configuration can suppress sharp quenching due to thermal storage even in the case where the source light has a high laser power density.

(2) In the wavelength conversion member of the invention, the ratio of the volume of the larger particles to the volume of the smaller particles is not more than 4. With this configuration, the passage of source light can be lessened more efficiently.

(3) In the wavelength conversion member of the invention, the ratio of the volume of the larger particles to the volume of the smaller particles is not less than 1.5. With this configuration, the fluorescent intensity of the larger particle size can be ensured, and further the interfaces between particles are decreased and the thermal resistance is reduced, making it possible to suppress quenching.

(4) In the wavelength conversion member of the invention, the average particle size of the larger particles is 10 to 20 µm, and the average particle size of the smaller particles is 2.5 to 10 µm. The wavelength conversion member having this configuration is more suited to constitute a light emitting device.

(5) A light emitting device of the present invention includes a light source which generates source light having a specific wavelength, and the wavelength conversion member described in any of (1) to (4) which absorbs the source light and emits light with other wavelength converted from the source light. The light emitting device having this configuration can emit a large amount of fluorescence while preventing the passage of the source light, and shows a resistance to sharp quenching due to thermal storage even in the case where the laser power density is high.

(6) A method for producing a wavelength conversion member of the present invention is a method for producing a wavelength conversion member configured to convert light with a specific wavelength to light with other wavelength, the method including a step of providing groups of phosphor particles having different average particle sizes, and preparing a paste containing each group of the phosphor particles at a predetermined proportion, a step of applying the paste to a substrate, and a step of heat treating the substrate having the paste applied thereon. With this configuration, the proportion of voids can be reduced and the passage of source light can be lessened without causing a decrease in light conversion efficiency offered by the phosphor particles having a large particle size.

Advantageous Effects of Invention

According to the present invention, the proportion of voids can be reduced and the passage of source light can be lessened without causing a decrease in light conversion efficiency offered by phosphor particles having a large particle size.

DESCRIPTION OF EMBODIMENTS

Figure 1:
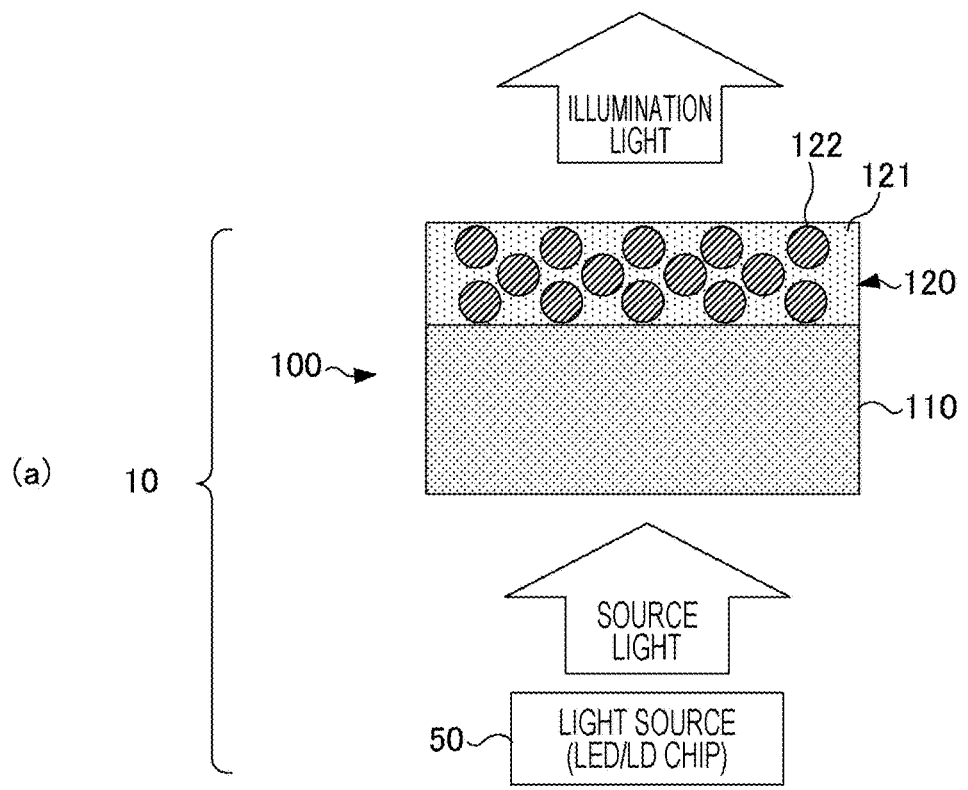
FIGS. 1(a) and 1(b) are schematic views illustrating transmission-type and reflection-type light emitting devices, respectively, according to the present invention.
Figure 1:
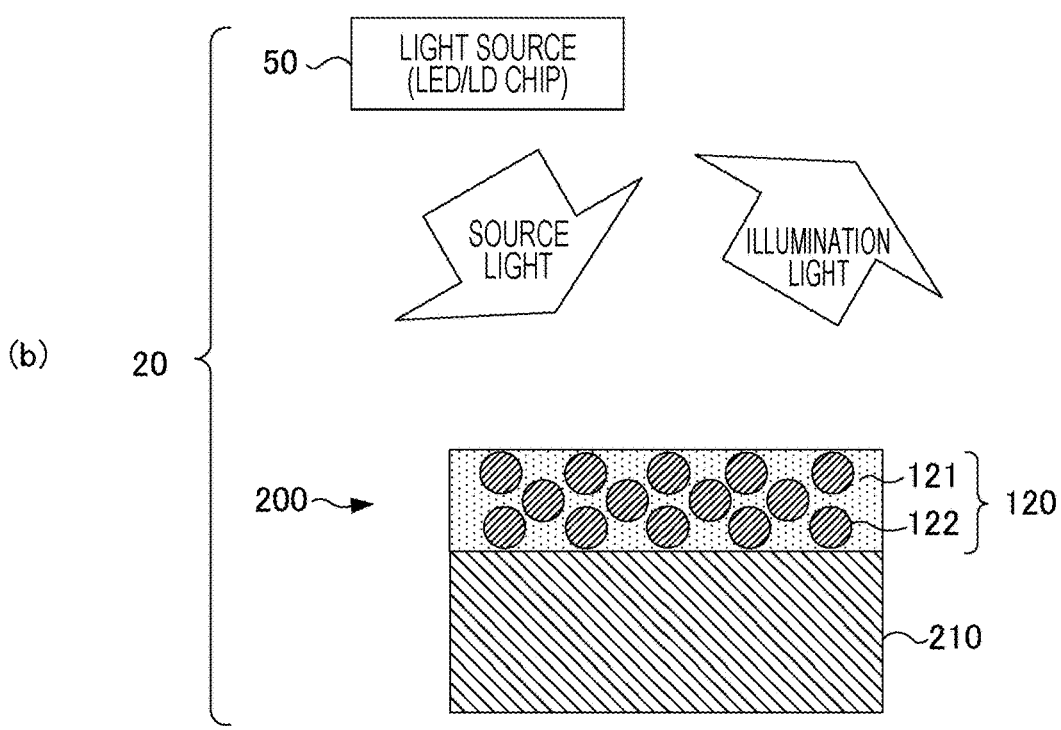

Next, embodiments of the present invention will be described with reference to the drawings. To facilitate the understanding of the description, the same reference numerals will be used for the same elements in the drawings, and overlaps in the description will be omitted. In the drawings, the size of the elements is only illustrative and is not to actual scale.

[Configurations of Transmission-Type Light Emitting Devices]

FIG. 1(a) is a schematic view of a transmission-type light emitting device. As illustrated in FIG. 1, the light emitting device 10 includes a light source 50 and a wavelength conversion member 100 and is configured so that source light passed through the wavelength conversion member 100 and light generated within the wavelength conversion member 100 by excitation with the source light are combined and emitted as illumination light. The illumination light may be, for example, white light.

The light source 50 may be a chip of an LED (light-emitting diode) or an LD (laser diode). An LED generates source light (excitation light) having a specific range of wavelength in accordance with the design of the light emitting device 10. For example, the LED generates blue light. When an LD is used, coherent light having little variations in wavelength and phase can be generated. The light source 50 is not limited to those described above and may be a light source that emits light other than visible lights. A preferred light source is one that generates ultraviolet light, violet light, blue light or green light. Such a light emitting device 10 is expected to provide high effects when applied to, for example, illumination of factories and public facilities such as stadiums and art museums where a large area is illuminated from a height, or long-distance illumination such as automobile headlight lamps.

[Configurations of Transmission-Type Wavelength Conversion Members]

The wavelength conversion member 100 includes a substrate 110 and a phosphor layer 120, and is sheet-shaped and is configured to transmit source light and to be excited by the source light so as to generate light with a different wavelength. For example, the wavelength conversion member 100 may be such that it transmits blue source light and the phosphor layer converts the source light into green and red or yellow fluorescences, which are also transmitted. The substrate 110 is sheet-shaped and may include, for example, an inorganic material that transmits source light, such as glass or sapphire. The substrate 110 preferably includes sapphire having high thermal conductivity.

(Phosphor Layers)

The phosphor layer 120 is provided in the form of a film on the substrate 110, and is formed from phosphor particles 122 and a translucent ceramic 121. The translucent ceramic 121 binds the phosphor particles 122 to one another and also binds the substrate 110 and the phosphor particles 122. With this configuration, a region on the incident side which is more prone to generating heat upon irradiation with light at a high energy density is joined with the substrate 110 that functions as a dissipator, and consequently heat can be dissipated efficiently and the thermal quenching of the phosphor can be suppressed. In the transmission type, the film thickness of the phosphor layer 120 is appropriately 2 to 400 µm, and is preferably 30 to 80 µm.

In the structure, the translucent ceramic components bury gaps between the phosphor particles at and near the interface between the phosphor layer and the substrate 110. As a result, routes through which heat is dissipated to the substrate 110 are ensured, and consequently the heat dissipation function is enhanced.

The translucent ceramic 121 is an inorganic binder that serves to hold the phosphor particles 122 together, and includes, for example, silica (SiO2) or aluminum phosphate. For example, the phosphor particles 122 may be an yttrium/aluminum/garnet-based phosphor (YAG-based phosphor) and a lutetium/aluminum/garnet-based phosphor (LAG-based phosphor).

Further, the phosphor particles 122 may be selected from the following materials in accordance with the design of a color to be emitted. Examples of such phosphors include blue phosphors such as $BaMgAl_{10}O_{17}$:Eu, ZnS:Ag,Cl, $BaAl_2S_4$:Eu and $CaMgSi_2O_6$:Eu, yellow or green phosphors such as $Zn_2SiO_4$:Mn, $(Y,Gd)BO_3$:Tb, ZnS:Cu,Al, $(M1)_2SiO_4$:Eu, $(M1)(M2)_2S$:Eu, $(M3)_3Al_5O_{12}$:Ce, SiAlON:Eu, CaSiAlON:Eu, $(M1)Si_2O_2N$:Eu and $(Ba,Sr,Mg)_2SiO_4$:Eu,Mn, yellow, orange or red phosphors such as $(M1)_3SiO_5$:Eu and (M1)S:Eu, and red phosphors such as $(Y,Gd)BO_3$:Eu, $Y_2O_2S$:Eu, $(M1)_2Si_5N_8$:Eu, $(M1)AlSiN_3$:Eu and $YPVO_4$:Eu. In these formulae, M1 includes at least one selected from the group consisting of Ba, Ca, Sr and Mg, M2 includes at least one of Ga and Al, and M3 includes at least one selected from the group consisting of Y, Gd, Lu and Te. The phosphor particles 122 described above are only examples, and the phosphor particles 122 used in the wavelength conversion member 100 are not necessarily limited to those mentioned above.

The phosphor particles 122 include two kinds of particles each having a designated particle size distribution. That is, the two kinds of phosphor particles have different particle size distributions. The designated particle size distribution is a distribution having a single peak such as, for example, normal distribution or Gaussian distribution. The two kinds of particles include larger particles having a larger average particle size and smaller particles having a smaller average particle size, and the particles having these two grain sizes represent not less than 70 vol % of the entirety.

The ratio of the average particle size of the larger particles to the average particle size of the smaller particles is 2 to 4, and the ratio of the volume of the larger particles to the volume of the smaller particles is not more than 5.7. As a result of the larger particles and the smaller particles being mixed with a ratio of 8.5 or less for the larger particles to 1.5 or more for the smaller particles, the proportion of voids can be reduced and the passage of source light can be lessened without causing a decrease in light conversion efficiency offered by the larger particles. Further, it is possible to suppress sharp quenching due to thermal storage even in the case where source light having a high laser power density is applied.

Specifically, the average particle size of the larger particles is preferably 10 to 20 μm, and the average particle size of the smaller particles is preferably 2.5 to 10 μm. The wavelength conversion member 100 obtained in this case is suited to constitute a light emitting device 10. The average particle sizes may be calculated from frequency date of the grain size distribution created by measuring the particle sizes of all the particles with respect to a SEM image of a polished cross section. The particles that are a mixture of two grain sizes show two peaks, and the corresponding particle sizes may be obtained as the respective average particle sizes. Even in the case where the peaks overlap with each other, the average particle sizes may be roughly calculated from the shoulders of the peaks.

The ratio of the volume of the larger particles to the volume of the smaller particles is preferably not more than 5.7. Specifically, the larger particles and the smaller particles are mixed with a volume ratio of 8.5 or less for the larger particles to 1.5 or more for the smaller particles, and such mixing leads to a reduced proportion of voids and thus makes it possible to reduce the passage of source light more efficiently.

If the amount of the smaller particles is excessively large, the particles come to have an increased number of interfaces and cause thermal resistance to increase, with the result that heat is stored even by laser irradiation at a low power density. In view of this, the ratio of the volume of the larger particles to the volume of the smaller particles is preferably not less than 1.5. Specifically, the larger particles and the smaller particles are mixed with a volume ratio of 6 or more for the larger particles to 4 or less for the smaller particles, and such mixing leads to a reduced number of interfaces between the particles and a consequent decrease in thermal resistance, making it possible to suppress quenching.

By using the grain size distribution data for the determination of the average particle sizes and while assuming that the grain size distribution is a symmetric normal distribution and that the particles are perfect spheres, the frequency ratio of the modes (which may be average values or median values) is calculated. Further, the volume of a single particle is calculated assuming that the diameter of the particle is equal to the average particle size, and the volumes thus calculated are multiplied by the respective proportions in the frequency ratio. The volume ratio may be thus determined.

As described above, two groups of phosphor particles having respective particle size distributions are mixed in a specific ratio to ensure that the smaller particles enter into voids between the larger particles. In this manner, the passage of source light can be lessened, and the proportion of voids in the phosphor layer can be reduced to ensure heat dissipation routes.

[Configurations of Reflection-Type Light Emitting Devices]

FIG. 1(b) is a schematic view of a reflection-type light emitting device 20. As illustrated in FIG. 1(b), the light emitting device 20 includes a light source 50 and a wavelength conversion member 200 and may be configured so that, for example, source light reflected by the wavelength conversion member 200 and light generated within the wavelength conversion member 100 by converting the wavelength of the source light are combined and emitted as illumination light, for example, white light.

The wavelength conversion member 200 includes a substrate 210 and a phosphor layer 120, and is sheet-shaped and is configured to reflect source light on the substrate 210 and to be excited by the source light so as to generate light with a different wavelength. The substrate 210 is sheet-shaped and may be made of, for example, an inorganic material capable of reflecting source light. Preferably, the substrate 210 includes aluminum. Adopting such a substrate 210 with high thermal conductivity can reduce the storage of heat in the phosphor layer 120, can suppress the temperature increase of the phosphor particles, and can prevent thermal quenching. Similarly as described above, such a light emitting device 20 can be prevented from a decrease in fluorescent performance even when continuing to emit light at a high output. To further increase the reflectance, it is preferable that an Ag film be disposed on the surface of the substrate. In the reflection type, the film thickness of the phosphor layer 120 is appropriately 2 to 400 μm, and is preferably 20 to 80 μm.

[Methods for Fabricating Wavelength Conversion Members]

Figure 2:
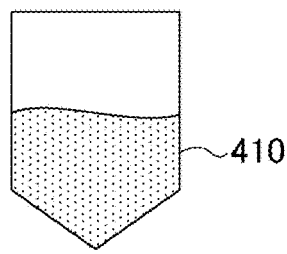
FIGS. 2(a) to 2(c) are each a view illustrating a step in the fabrication of a wavelength conversion member of the present invention.
Figure 2:
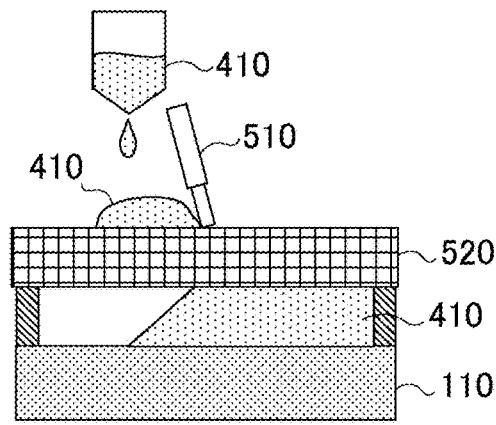
Figure 2:
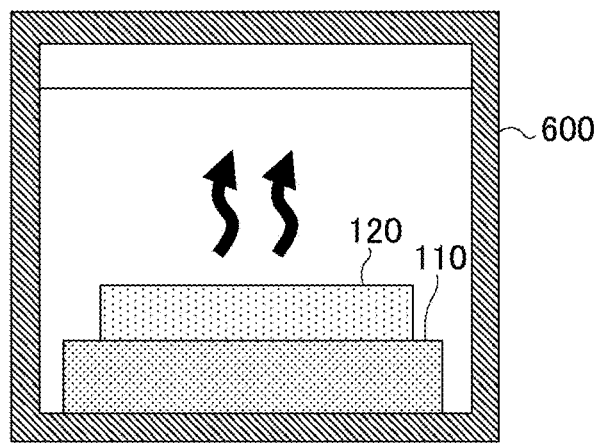

FIGS. 2(a) to 2(c) are each a view illustrating a step in the fabrication of a wavelength conversion member of the invention. First, phosphor particles, an inorganic binder and a dispersion medium are provided. For example, the phosphor particles may be particles of YAG, LAG and the like. The types and amounts of the phosphor particles are controlled depending on the target illumination light in association with the source light. When, for example, white light is to be obtained from blue light, appropriate amounts of particles of phosphors that are excited by blue light to emit green light and red or yellow light are selected.

For example, a preferred inorganic binder may be ethyl silicate obtained by dissolving a silicon precursor into ethanol. Alternatively, the inorganic binder may be one obtained by reacting at room temperature or heat treating at a temperature of not more than 500° C. a raw material including at least one selected from the group consisting of silicon oxide precursors which form silicon oxide by hydrolysis or oxidation, silicic acid compounds, silica and amorphous silica. Examples of the silicon oxide precursors include those based on perhydropolysilazane, ethyl silicate or methyl silicate. The dispersion medium may be a high-boiling solvent such as butanol, isophorone, terpineol or glycerol.

As illustrated in FIG. 2(a), the inorganic binder, the dispersion medium and the two types, larger and smaller, phosphor particles are mixed with each other to give a paste (an ink) 410. The mixing may be performed with a device such as a ball mill. Separately, a substrate made of an inorganic material is provided. The substrate may be glass or sapphire. The substrate is preferably in the form of a sheet.

Next, as illustrated in FIG. 2(b), the paste 410 is applied onto the substrate 110 by a screen printing method so that the film thickness will have a ratio mentioned hereinabove to the average particle size. The screen printing may be performed by squeezing the paste 410 through a framed silk screen 520 with use of an ink squeegee 510. Besides screen printing, the paste may be applied by spraying, dispenser drawing or inkjetting. A screen printing method is preferable in order to form a thin phosphor layer stably.

As illustrated in FIG. 2(c), the printed paste 410 is dried and is heat treated in a furnace 600 to evaporate the dispersion medium as well as to drive off the organic matter in the inorganic binder and to oxidize the predominant metal in the inorganic binder (when the predominant metal is Si, to convert the metal into $SiO_2$) while performing bonding of the phosphor layer 120 with the substrate 110. A wavelength conversion member 100 that can reduce the passage of source light therethrough can be thus manufactured. A light emitting device may be fabricated by appropriately arranging the wavelength conversion member obtained, with respect to a light source such as an LED.

Examples (1. Evaluation of Reduction of Passage of Source Light)
(1-1) Sample Fabrication Method Wavelength conversion members of Examples 1 to 4 and Comparative Examples 1 to 4 were fabricated. First, two kinds of phosphor particles (YAG, the same applies hereinafter) having different particle sizes (average particle sizes of 6 μm and 18 μm) were each mixed together with ethyl silicate and terpineol as an inorganic binder and a dispersion medium, respectively, to give two kinds of pastes. The two kinds of pastes were mixed together so that the two kinds of particles would have a mixing ratio (a volume ratio) described in the table below. The paste thus prepared was applied to a sapphire sheet as a substrate by a screen printing method so that the film thickness would be 40 μm, and the wet film was heat treated, thereby obtaining a sample wavelength conversion member. Because the phosphor particles are not broken or fused together by the heat treatment, the average particle sizes of the phosphor particles in the wavelength conversion member are similar to the average particle sizes of the phosphor particles in the raw material.

The average particle sizes of the phosphor were measured using laser diffraction/scattering particle size distribution analyzer "HORIBA (HORIBA, Ltd.) LA-960". The volume ratio was calculated by dividing the weights of the phosphor particles having the respective particle sizes with the density.

TABLE 1

| | Ratios of phosphor particles mixed | |
|---|---|---|
| | Particle size 18 μm | Particle size 6 μm |
| Comp. Ex. 1 | 10 | 0 |
| Comp. Ex. 2 | 9 | 1 |
| Ex. 1 | 8.5 | 1.5 |

TABLE 1-continued

| | Ratios of phosphor particles mixed | |
|---|---|---|
| | Particle size 18 μm | Particle size 6 μm |
| Ex. 2 | 8 | 2 |
| Ex. 3 | 7 | 3 |
| Ex. 4 | 6 | 4 |
| Comp. Ex. 3 | 5 | 5 |
| Comp. Ex. 4 | 0 | 10 |

(1-2) Evaluation Method

The emission intensity of source light was evaluated with respect to the samples of Comparative Examples 1 to 4 and Examples 1 to 4 obtained as described above. Specifically, the samples were irradiated with laser light to examine the emission intensity of the transmitted source light at various laser input values. Incidentally, the fluorescent emission intensity is the relative intensity obtained by converting to dimensionless the value shown on a luminance meter during the measurement with the evaluation system.

Figure 3:
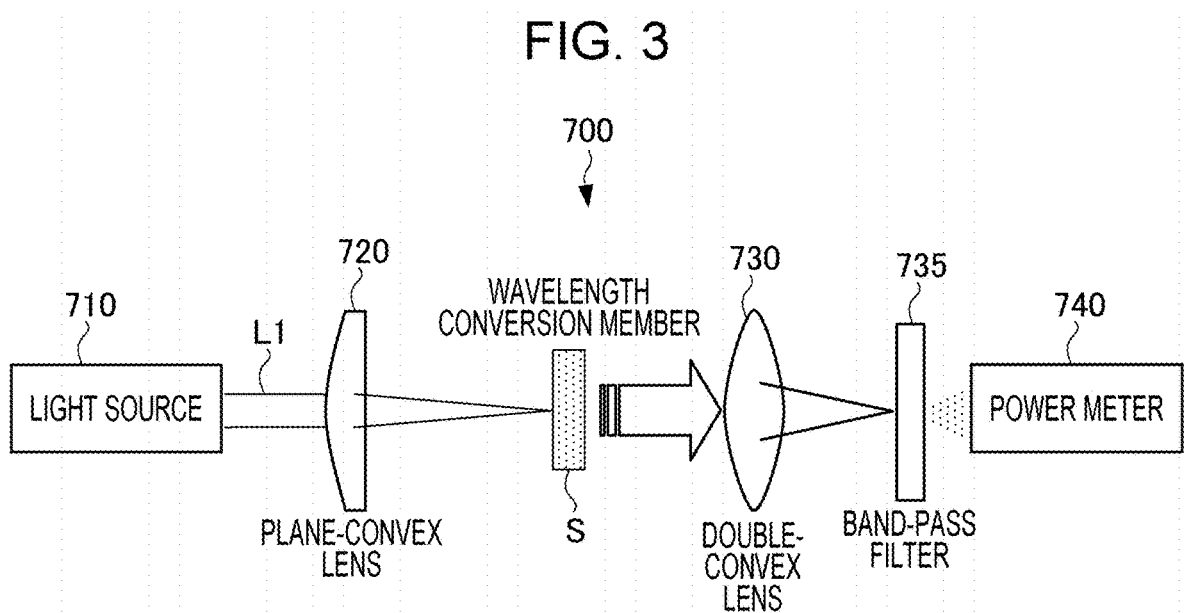
FIG. 3 is a view illustrating a transmission-type system for evaluating a wavelength conversion member.

FIG. 3 is a view illustrating a transmission-type evaluation system for the evaluation of wavelength conversion members. As illustrated in FIG. 3, the transmission-type evaluation system 700 is composed of a light source 710, a plane-convex lens 720, a double-convex lens 730, a band-pass filter 735 and a power meter 740. These elements are arranged so that the light passed through the wavelength conversion member S can be gathered and analyzed.

The band-pass filter 735 is a filter that blocks light based on 480 nm wavelength as the threshold. In the measurement of transmitted source light, a filter that blocks higher wavelengths is used. A filter that screens out lower wavelengths is used for the measurement of fluorescent emission intensity. The filter is disposed between the double-convex lens and the power meter in order to separate the source light (excitation light) that has passed through, and the fluorescent light from each other.

In the system configured as described above, the source light that has entered into the plane-convex lens 720 is condensed to a focus on the sample S of wavelength conversion member. The radiation emitted from the sample S is gathered by the double-convex lens 730. The gathered light is filtered through the band-pass filter 735 to screen out undesired components, and the intensity of the remainder light is measured with the power meter 740. The value measured is the fluorescent emission intensity. By condensing the laser light with the lens to focus on a narrow irradiation area, the energy density per unit area can be increased even with a low-output laser. This energy density is the laser power density.

Figure 4:
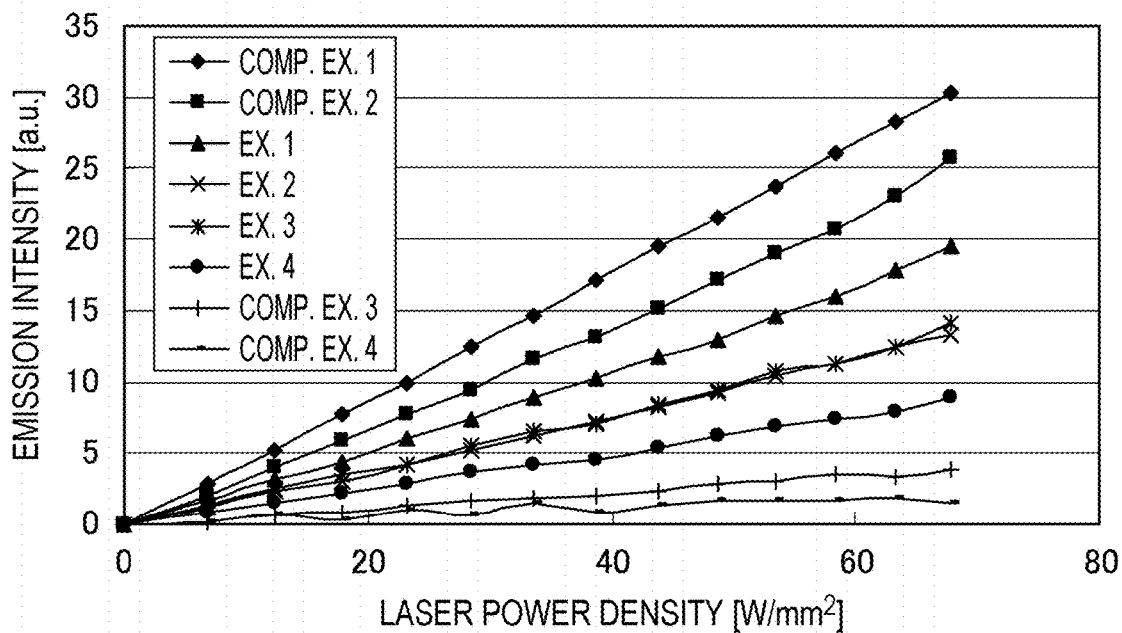
FIG. 4 is a graph illustrating the emission intensities of transmitted source light at various laser power densities.

FIG. 4 is a graph illustrating the emission intensities of transmitted source light at various laser power densities. As illustrated in FIG. 4, the comparison of Comparative Example 1 with Comparative Example 4 shows that the sample containing large particles alone allowed the source light to pass therethrough at a higher intensity than the sample exclusively containing small particles.

In a wavelength conversion member containing small particles, the phosphor particles are densely arranged on the substrate to make it difficult for source light to pass therethrough, while a wavelength conversion member containing large particles alone transmits source light probably because it has many voids between the phosphor particles.

Comparative Example 2 and Examples 1 to 4 showed a tendency in which the intensity of excitation light was decreased with increasing proportion of the smaller particles. The intensities of transmitted excitation light were similar in Examples 2 and 3. By the mixing of smaller and larger phosphor particles, the resultant wavelength conversion member attains a structure in which the gaps between the larger particles are buried by the smaller particles, and, probably because of such a structure, transmits less excitation light.

Figure 5:
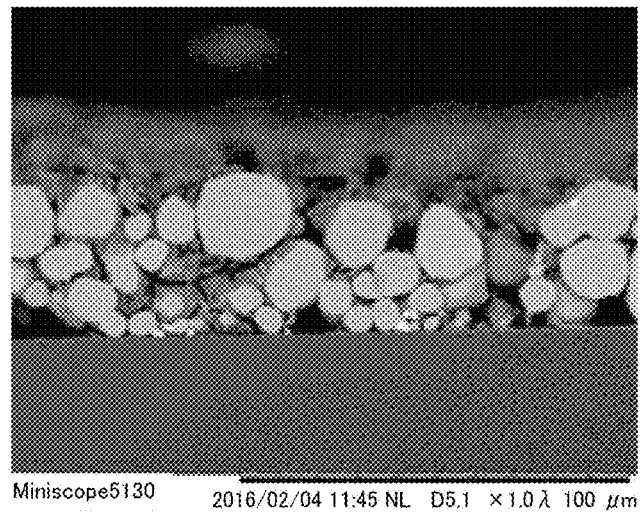
FIGS. 5(a) to 5(c) are each a SEM image of a partial cross section of a wavelength conversion member.
Figure 5:
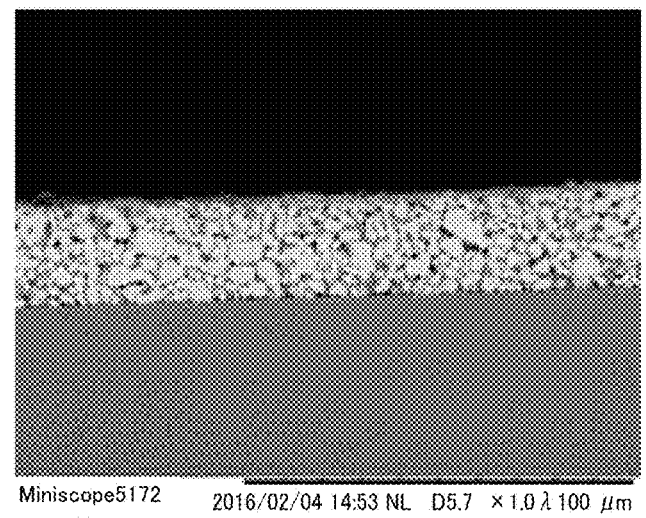
Figure 5:
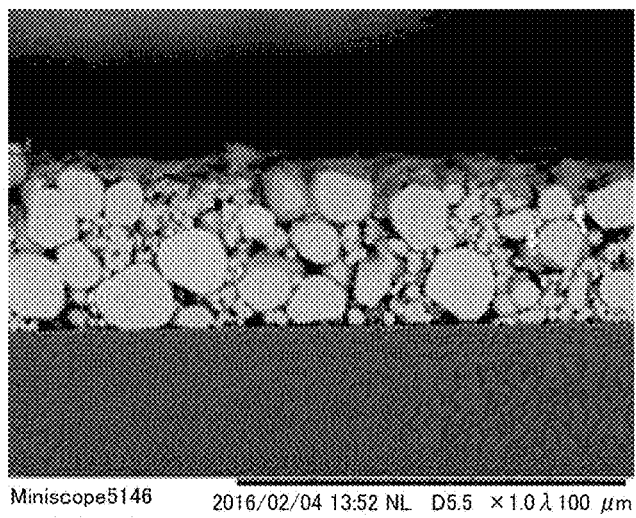

In consideration of the above results, the samples of Comparative Examples 1 and 4 and Example 2 were cut and their cross sections were observed by SEM. FIGS. 5(a) to 5(c) are SEM images showing the partial cross sections of the respective wavelength conversion members. As illustrated in FIG. 5(a), the sample of Comparative Example 1 was shown to have voids between the phosphor particles with a large particle size. In the sample of Comparative Example 4, as illustrated in FIG. 5(b), the phosphor particles with a small particle size were packed. In the sample of Example 2 which involved two grain sizes, as illustrated in FIG. 5(c), the phosphor particles with a smaller particle size filled the voids between the phosphor particles with a larger particle size.

(2. Spectrum Evaluation)

Figure 6:
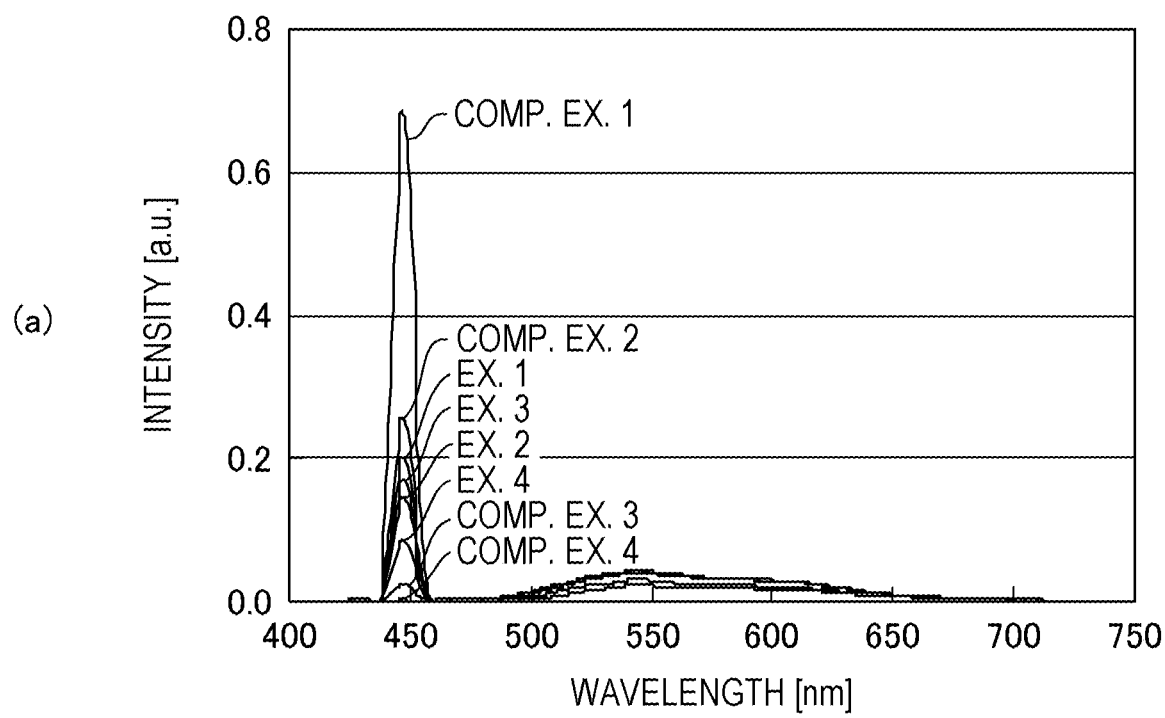
FIGS. 6(a) and 6(b) are a graph illustrating the emission intensities of wavelengths at a laser power density of 40 W/mm$^2$, and an enlarged view of the graph, respectively.
Figure 6:
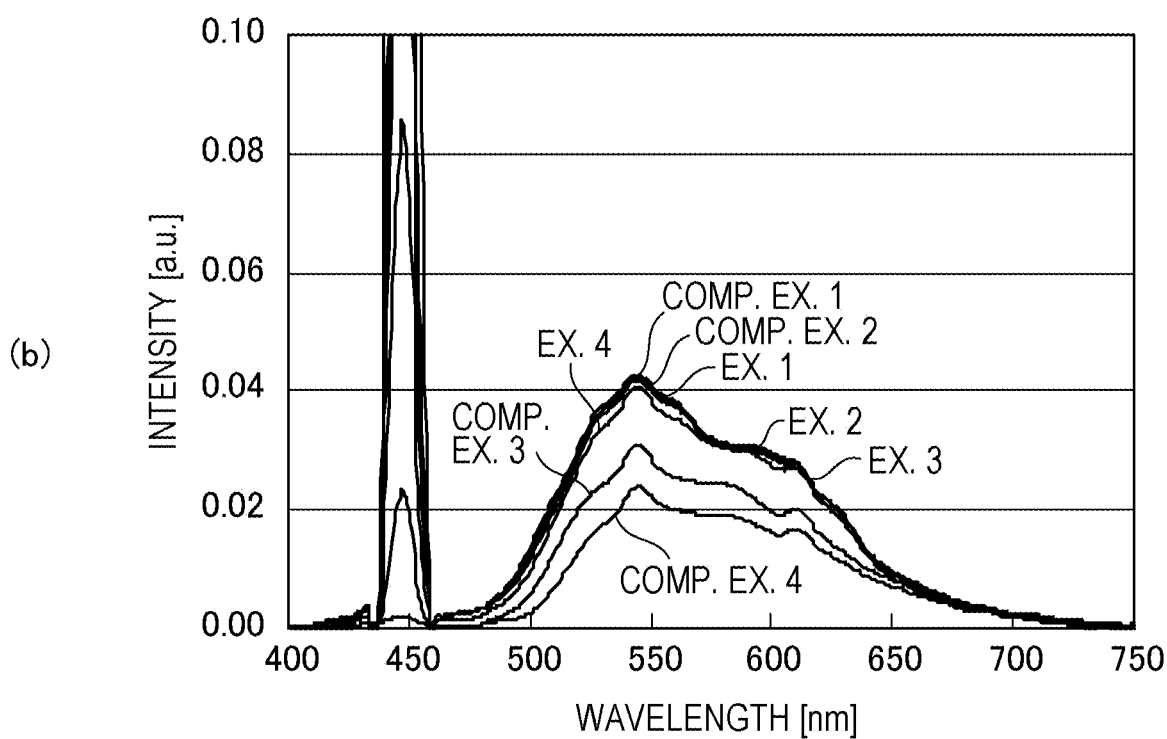

FIGS. 6(a) and 6(b) are a graph illustrating emission spectra at a laser power density of 40 W/mm$^2$, and an enlarged view of the graph, respectively. As illustrated in FIGS. 6(a) and 6(b), Comparative Example 1 showed a high intensity at a range of wavelengths corresponding to blue light; in contrast, Examples 1 to 4 attained a reduction of the passage of source light having wavelengths corresponding to blue light while allowing the fluorescence to be emitted at a similar intensity as Comparative Example 1.

(3. Evaluation of Suppression of Thermal Storage)

Figure 7:
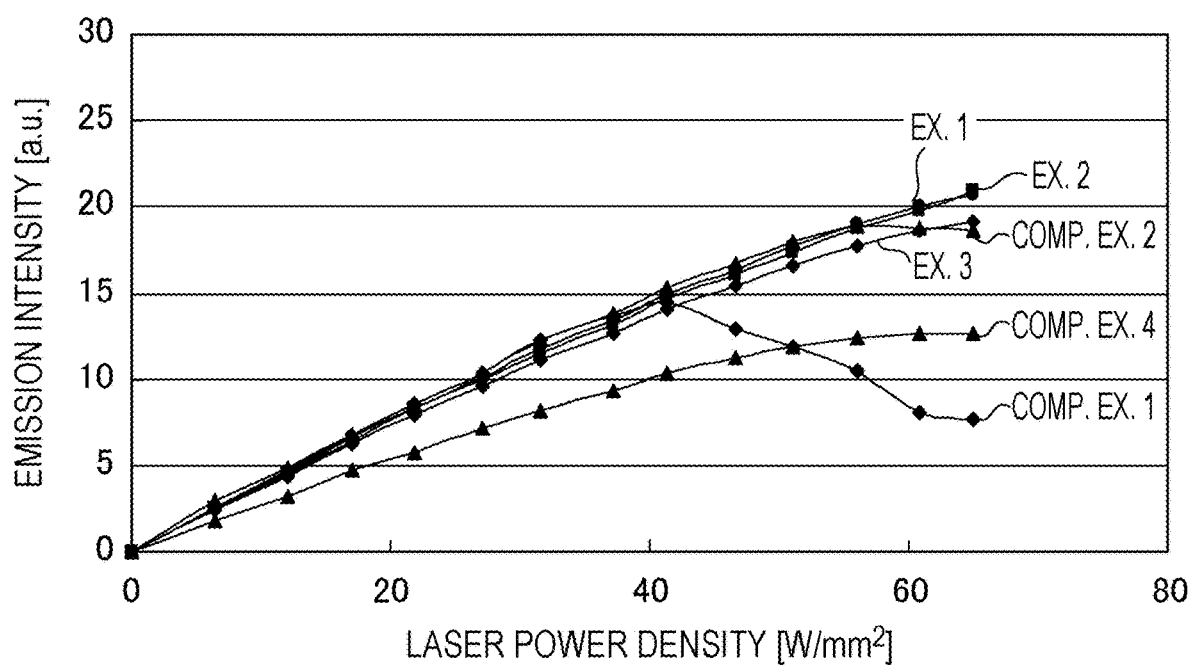
FIG. 7 is a graph illustrating fluorescent emission intensities at various laser power densities.

The samples of Examples 1 to 3 and Comparative Examples 1, 2 and 4 were subjected to a transmission-type laser irradiation test, and the fluorescent emission intensities were examined at various laser power densities. FIG. 7 is a graph illustrating the fluorescent emission intensities at various laser power densities.

From the comparison between Comparative Example 1 and Comparative Example 4, the sample of Comparative Example 1 exclusively containing large particles showed a higher fluorescent emission intensity than the sample of Comparative Example 4 containing only small particles. The reason for this result is probably because large phosphor particles convert light into fluorescence with a higher efficiency than small phosphor particles. On the other hand, the results of Examples 1 to 3 have shown that even when large particles are mixed together with small particles having a ratio of 1.5 to 3 (15% to 30%), the large particles which offer conversion efficiency are still predominant and the emission intensity is not decreased.

Further, while the sample of Comparative Example 1 exclusively containing large particles suffered sharp phosphor quenching due to thermal storage at laser power densities of 41 W/mm$^2$ and above, the sample of Comparative Example 4 containing small particles alone showed very slow phosphor quenching due to thermal storage even at high laser power densities.

The reason why phosphor quenching due to thermal storage is retarded is probably because small particles are densely arranged on a substrate by virtue of their small size and consequently the phosphor particles form less voids in the structure to facilitate the formation of routes through which heat generated in the phosphor layer is dissipated.

In contrast, a collection of large particles contains many voids and the air in the voids stores heat. This is probably the reason why the phosphor is sharply quenched when irradiated with laser light at a high power density. In Examples 1 to 3, the timing at which phosphor quenching occurred due to thermal storage shifted toward a higher energy, and the tendency of decrease in fluorescent emission intensity was lower with increasing proportion of the smaller particles.

Comparative Example 2 in which smaller particles had been added in a ratio of 1 resulted in phosphor quenching at 56 W/mm$^2$. In contrast, quenching was retarded in Examples 1 to 3 which involved smaller particles in a ratio of 1.5 to 3 (15% to 30%), and the effect on reduction of thermal storage in the phosphor layer was thus confirmed.

(4. Evaluation of Particle Size Ratios)

(4-1) Sample Fabrication Method

Large phosphor particles having an average particle size of 18 μm, and six kinds of small phosphor particles having an average particle size of 18, 9, 6, 4.5, 3.5 or 3 μm were each mixed together with ethyl silicate and terpineol as an inorganic binder and a dispersion medium, respectively, to give pastes. Two of these pastes were mixed so that the mixing ratio (the volume ratio) of the large particles to the small particles would be 8:2. The pastes thus prepared were each applied to a sapphire sheet as a substrate by a screen printing method so that the film thickness would be 40 μm, and the wet films were heat treated. Sample wavelength conversion members were thus obtained.

(4-2) Evaluation Method

The samples fabricated as described above were subjected to a transmission-type laser irradiation test to examine the emission intensity of the fluorescence and the intensity of the transmitted source light at a laser power of 50 W/mm$^2$. Further, the relative emission intensities obtained with each of the particle size ratios were determined assuming that the emission intensities of the fluorescence and the source light obtained when the particle size ratio was 1.0 were each 100%.

(4-3) Results

The results are described in the table below. When the particle size ratio of the large particles to the small particles was 2.0 to 4.0, the passage of source light was reduced to less than 70% while maintaining not less than 90% of the fluorescent intensity obtained with the large particle size alone. While Examples discussed above use YAG as the material of the phosphor particles, similar effects are expected even when the phosphor is other material such as LAG.

TABLE 2

| | Size of large particles | Size of small particles | Large/small particle size ratio | Emission intensities | | Relative emission intensities | |
|---|---|---|---|---|---|---|---|
| | | | | Fluorescence | Source light | Fluorescence [%] | Source light [%] |
| Comparative Example | 18 | 18 | 1.0 | 15.8 | 21.6 | 100.0 | 100.0 |
| Example | 18 | 9 | 2.0 | 15.4 | 14.8 | 97.5 | 68.5 |
| Example | 18 | 6 | 3.0 | 15.3 | 9.2 | 96.8 | 42.6 |
| Example | 18 | 4.5 | 4.0 | 15.3 | 6.4 | 96.8 | 29.6 |

TABLE 2-continued

| | Size of large particles | Size of small particles | Large/small particle size ratio | Emission intensities | | Relative emission intensities | |
| --- | --- | --- | --- | --- | --- | --- | --- |
| | | | | Fluorescence | Source light | Fluorescence [%] | Source light [%] |
| Comparative Example | 18 | 3.5 | 5.1 | 14.2 | 4.2 | 89.9 | 19.4 |
| Comparative Example | 18 | 3 | 6.0 | 13.5 | 2.1 | 85.4 | 9.7 |

REFERENCE SIGNS LIST 10, 20 LIGHT EMITTING DEVICES
50 LIGHT SOURCE
100 WAVELENGTH CONVERSION MEMBER
110, 210 SUBSTRATES
120 PHOSPHOR LAYER
121 TRANSLUCENT CERAMIC
122 PHOSPHOR PARTICLES
410 PASTE
510 INK SQUEEGEE
520 SILK SCREEN
600 FURNACE
700 EVALUATION SYSTEM
710 LIGHT SOURCE
720 PLANE-CONVEX LENS
730 DOUBLE-CONVEX LENS
735 BAND-PASS FILTER
740 POWER METER

The invention claimed is:

1. A wavelength conversion member configured to convert light with a specific wavelength to light with other wavelength, wherein
the wavelength conversion member comprises:
a substrate including an inorganic material, and
a phosphor layer joined to the substrate and including phosphor particles that absorb light and emit converted light and a translucent ceramic that binds the phosphor particles to one another;
the phosphor particles include two kinds of particles each having a designated particle size distribution;
the two kinds of particles are larger particles having a larger average particle size and smaller particles having a smaller average particle size wherein the ratio of the average particle size of the larger particles to the average particle size of the smaller particles is 2 to 4; and
the ratio of the volume of the larger particles to the volume of the smaller particles is not more than 5.7.

2. The wavelength conversion member according to claim 1, wherein the ratio of the volume of the larger particles to the volume of the smaller particles is not more than 4.

3. The wavelength conversion member according to claim 1, wherein the ratio of the volume of the larger particles to the volume of the smaller particles is not less than 1.5.

4. The wavelength conversion member according to claim 1, wherein the average particle size of the larger particles is 10 to 20 μm; and
the average particle size of the smaller particles is 2.5 to 10 μm.

5. A light emitting device comprising:
a light source which generates source light having a specific wavelength; and
the wavelength conversion member described in claim 1 which absorbs the source light and emits light with other wavelength converted from the source light.

6. The wavelength conversion member according to claim 1, wherein the substrate is made of sapphire or aluminum.

7. The wavelength conversion member according to claim 1, wherein:
the ratio of the volume of the larger particles to the volume of the smaller particles is not less than 1.5;
the average particle size of the larger particles is 10 to 20 μm; and
the average particle size of the smaller particles is 4.5 to 10 μm.

8. A method for producing a wavelength conversion member configured to convert light with a specific wavelength to light with other wavelength, the method comprising:
a step of providing groups of phosphor particles having different average particle sizes, and preparing a paste containing each group of the phosphor particles at a predetermined proportion;
a step of applying the paste to a substrate; and
a step of heat treating the substrate having the paste applied thereon;
wherein:
the phosphor particles include two kinds of particles each having a designated particle size distribution;
the two kinds of particles are larger particles having a larger average particle size and smaller particles having a smaller average particle size and the ratio of the average particle size of the larger particles to the average particle size of the smaller particles is 2 to 4; and
the ratio of the volume of the larger particles to the volume of the smaller particles is not more than 5.7.

* * * * *